United States Patent [19]

Hattori et al.

[11] Patent Number: 5,523,799
[45] Date of Patent: Jun. 4, 1996

[54] IMAGE STORING DEVICE INCLUDING AN INHIBITING FUNCTION

[75] Inventors: Yuichiro Hattori; Akira Nakaya, both of Yokohama; Tatsuro Yamazaki, Tachikawa, all of Japan

[73] Assignee: Canon Kabushika Kaisha, Tokyo, Japan

[21] Appl. No.: 274,666

[22] Filed: Jul. 13, 1994

Related U.S. Application Data

[63] Continuation of Ser. No. 871,486, Apr. 21, 1992, abandoned.

[30] Foreign Application Priority Data

Apr. 24, 1991 [JP] Japan ................. 3-094487
Apr. 24, 1991 [JP] Japan ................. 3-094488
Apr. 24, 1991 [JP] Japan ................. 3-094489

[51] Int. Cl.$^6$ .................................. H04N 5/907
[52] U.S. Cl. ............ 348/715; 358/337; 360/35.1; 369/44.33
[58] Field of Search ............... 348/716, 718, 348/719, 715; 345/200, 203; 358/908, 337, 338; 360/36.2, 35.1, 36.1, 14.1; 369/44.33, 44.32; H04N 5/907

[56] References Cited

U.S. PATENT DOCUMENTS

| | | | |
|---|---|---|---|
| 3,585,610 | 6/1971 | Bartlett | 340/173 |
| 4,890,262 | 12/1989 | Hashimoto et al. | 365/236 |
| 5,043,825 | 8/1991 | Heitmann et al. | 358/327 |
| 5,204,787 | 4/1993 | Suzuki et al. | 358/337 |
| 5,220,425 | 6/1993 | Enari et al. | 358/160 |
| 5,235,575 | 8/1993 | Han | 369/44.32 |
| 5,331,616 | 7/1994 | Morita et al. | 369/44.32 |

FOREIGN PATENT DOCUMENTS

| | | |
|---|---|---|
| 0213374 | 3/1987 | European Pat. Off. . |
| 0284987 | 11/1988 | Japan . |
| 0055480 | 2/1990 | Japan . |
| 4-70077 | 3/1992 | Japan . |

OTHER PUBLICATIONS

Crook, et al., "Solid State Video Recorder", International Broadcasting Convention 1988, Sep. 1988, London, UK, pp. 422–424.

Woodham et al., "A Solid State 'Action Replay' Recorder", Symposium Record Broadcast Sessions, Jun. 1989, Montreux, CH, pp. 289–295.

Oberbeck, "Design and Application of a Solid–State Video Disk System", National Aerospace and Electronics Conference, May 1984, New York, NY, pp. 62–67.

Kingelhofer et al., "HDTV Digital Frame Recorder", SMPTE Journal, vol. 100, No. 1, Jan. 1991, Scarsdale, New York, pp. 10–13.

*Primary Examiner*—Safet Metjahic
*Assistant Examiner*—Jeffrey S. Murrell

[57] ABSTRACT

A memory capable of memorizing a video signal has part of its address area into which an information signal is inhibited from being written. A writing address controller for cyclically specifying writing addresses of the memory cyclically specifies writing addresses in the remaining address area except for the part of address area to allow a plurality of different moving picture scenes to be memorized in the one and same memory.

For according to a large capacity main memory, a submemory is interposed to access to the main memory with a predetermined information amount being as the unit, thereby facilitating address management of the main memory as well as improving a utilizing effeciency of the main memory.

11 Claims, 7 Drawing Sheets

IMAGE STORING DEVICE INCLUDING AN INHIBITING FUNCTION

This is a continuation of application Ser. No. 07/871,486, filed on Apr. 21, 1992, now abandoned.

BACKGROUND OF THE INVENTION

1. Field of the Invention

The present invention relates to an image memorizing device, and more particularly, to an image memorizing device for processing a large amount of image data such as moving pictures by using large capacity memories.

2. Related Background Art

There have been known a kind of memory which is adapted to cyclically memorize data within its storage area by linking the end address of the storage area to the start address of the same and an addressing control therefor as a so-called ring memory, and an image memorizing device for storing image signals in such a ring memory has been also known.

In the ring memory, previously memorized information cannot be protected from being overwritten by next information due to the nature of its addressing control. For example, when moving pictures are to be memorized, a previously memorized image is lost by overwriting the next image, so that non-sequential images in terms of time cannot be obtained.

Incidentally, such an image memory tends to have a larger capacity and now becomes sufficiently usable as a recording medium for moving pictures. If a solid state memory such as a dynamic random access memory is used as a recording medium for moving pictures, there are advantages, e.g., a search can be performed at a high speed; data can be readily rearranged in the memory; and data can be recorded and reproduced at an arbitrary speed.

Generally, in an image signal processing circuit for processing moving pictures by using such a large capacity image memory, a digital video signal digitally converted from an analog signal, as it is, is written into an image memory by one frame portion or a plural-frame portion. Addressing of the image memory is controlled by a timing of a synchronous signal of an image signal to be written thereinto.

Conventionally, since an addressing control of an image memory is defined by a synchronizing timing of a synchronous signal, quite a few unused portion, as indicated by hatching in FIG. 1, is produced and left useless. This unused portion may occupy an unneglectable amount depending upon the number of horizontal pixels and the number of horizontal lines.

Specifically, a memory capacity assigned to one frame portion is, for example, a capacity for ($2^n \times 2^n$) pixels, as shown in FIG. 1, which has $2^n$ kinds of horizontal and vertical addresses, respectively. The number of scanning lines is 525 in the case of an NTSC signal and 625 in the case of a PAL signal, so that approximately 700–800 of horizontal pixels are required. Therefore, substituting 10 for n, approximately 1024 ($=2^{10}$) addresses are required for the horizontal pixels.

Further, in the case of a high vision signal, substituting 11 for n, 2048 addresses are required for each of the horizontal and vertical addresses.

Thus, the unused portions as shown in FIG. 1 include an extremely large amount of address, thereby exhibiting a quite low memory using efficiency. However, unless the address is reset in the horizontal scanning line units or frame units, management of the address in a large capacity memory becomes extremely difficult.

SUMMARY OF THE INVENTION

In view of the above-mentioned background, it is an object of the present invention to provide an image memorizing apparatus which is capable of writing a new moving image into a single large capacity memory while preserving a desired portion of moving images which have previously been written in the same memory.

To achieve the above object, according to one embodiment of the present invention, there is provided an image memorizing device comprising:

(a) input means for inputting a video signal;

(b) a memory into which the video signal inputted from the input means can be written;

(c) writing address control means for cyclically specifying a writing address of the memory; and (d) inhibiting means for inhibiting a video signal from being written into part of address area of the memory.

wherein the writing address control means cyclically specifies writing addresses for the remaining address area except for the part of address area when the inhibiting means inhibits a video signal from being written into the part of address area.

It is another object of the present invention to provide an image memorizing device which is capable of largely improving a using efficiency of a memory capacity in spite of relatively easy addressing management.

To achieve the above object, according to another embodiment of the present invention, there is provided an image memorizing apparatus comprising:

(a) a main memory capable of memorizing a video signal;

(b) access means for accessing the main memory to the outside; and (c) a sub-memory connected between the access means and the main memory, the sub-memory adapted to supply the main memory with a predetermined information amount of a video signal from the access means as the unit, the predetermined information amount being less than one frame portion of the video signal from the access means.

Objects other than those described above and features of the present invention will become apparent from the following detailed description of embodiments with reference to accompanying drawings.

DESCRIPTION OF THE PREFERRED EMBODIMENTS

Embodiments of the present invention will hereinafter be described with reference to the accompanying drawings.

Figure 1:
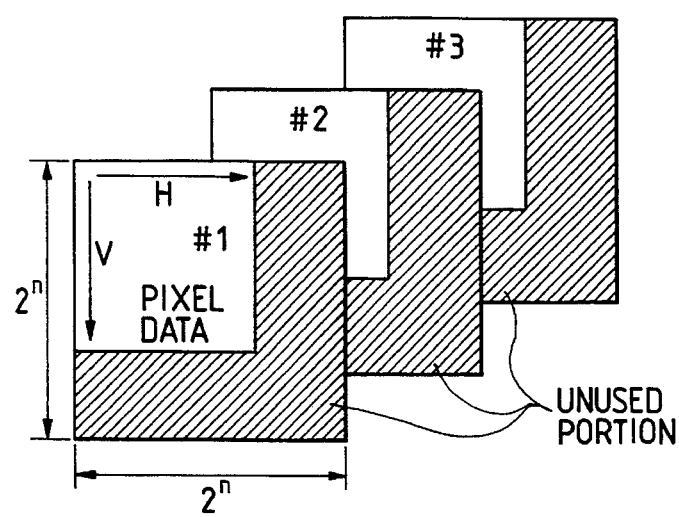
FIG. 1 is a diagram used for explaining an ordinary memory using situation.
Figure 2:
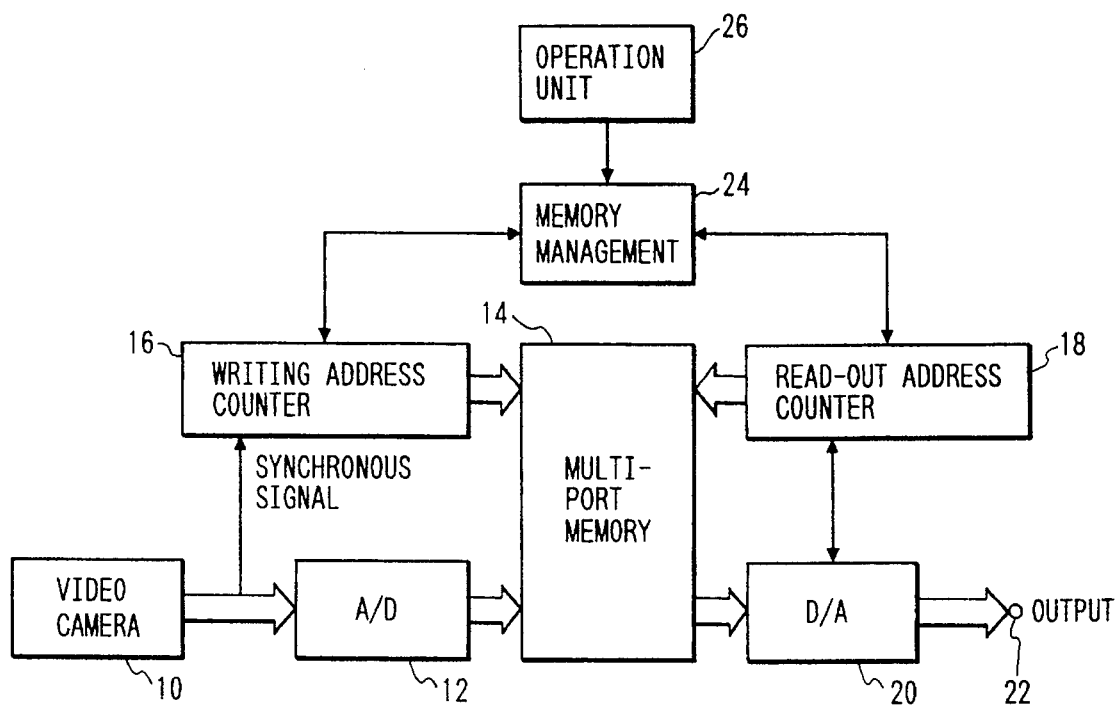
FIG. 2 is a block diagram showing the structure of an image memorizing apparatus as an embodiment of the present invention.

FIG. 2 is a block diagram showing the structure of an image memorizing device according to an embodiment of the present invention which is applied to output processing of a video camera. Reference numeral 10 designates a video camera; 12 an analog-to-digital (A/D) convertor for digitizing a video signal outputted from the video camera 10; and 14 a multi-port random access memory for memorizing a digital video signal outputted from the A/D convertor 12. In the present embodiment, the memory 14 may have a capacity of memorizing a several-second to approximately 50-second portion of video signals.

Reference numeral 16 designates a writing address counter for generating a writing address of the memory 14 in response to a synchronous signal multiplexed with the video signal outputted from the video camera 10; 18 a read-out counter for generating a read-out address of the memory 14; 20 a digital-to-analog (D/A) convertor for converting video data read from the memory 14 to an analog signal; and 22 an output terminal.

Also, reference numeral 24 designates a memory managing circuit for controlling the writing address counter 16 and the read-out address counter 18 in accordance with a writing inhibited area registered in the memory 14. The user can select through an operation unit 26 and register in the memory managing circuit 24 a writing inhibited area in the memory 14, that is, an arbitrary number of images to be preserved.

Figure 3:
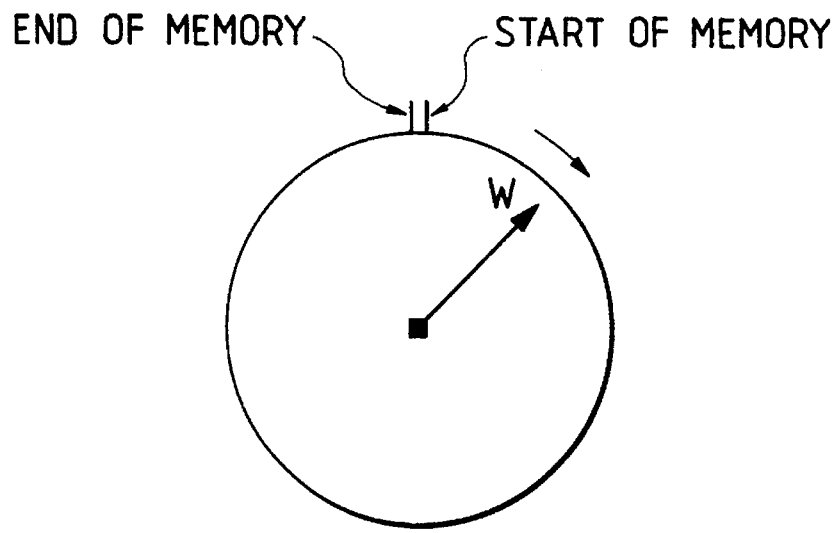
FIG. 3 is a diagram used for explaining the operation of a memory shown in FIG. 2.

Next, the operation of the above-mentioned image memorizing device will be described. A video signal outputted from the video camera 10 is digitized by the A/D convertor 12 and written into addresses indicated by the writing address counter 16. The address of the writing address counter 16 is incremented by the synchronous signal multiplexed with the video signal. The writing address counter 16 returns to the start address of the memory 14 by an increment after the end address of the memory 14 has reached. Thus, the memory 14 operates as a ring memory. FIG. 3 schematically illustrates the writing addresses of the memory 14. A writing position is represented as a vector W which rotates at an angular velocity ω.

If there is a scene to be preserved during making a film, the operation unit 26 is operated to specify a portion to be preserved immediately after the scene has been written into the memory 14. With this operation, the memory managing circuit 24 instructs a writing inhibition to addresses in the memory 14 corresponding to the portion to be preserved. In this event, an arbitrary address area of the memory 14 can be specified, and the size of the area can be arbitrarily set.

Figure 4:
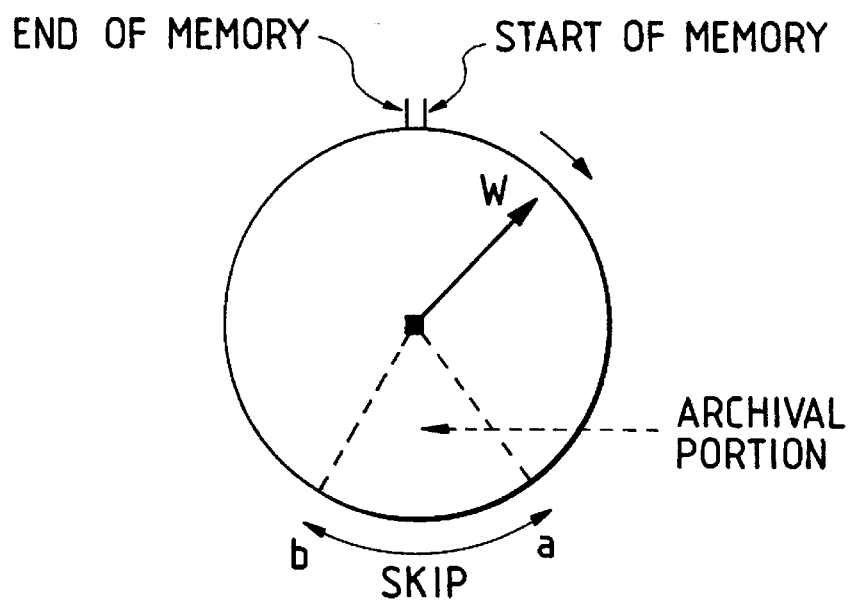
FIG. 4 is a diagram used for explaining the operation of the memory in FIG. 2 when a writing inhibited area is set therein.

After completing the registration (setting), film-making is resumed. The writing address counter 16 skips writing addresses for the address area registered in the memory managing circuit 24. For example, if it is assumed that an area between points a and b shown in FIG. 4 is registered as a writing inhibited area, the writing vector W, when reaching the point a, skips the area between the points a and b, and then writes data at the point b. Thus, video data memorized in the area between the points a and b is preserved.

Figure 5:
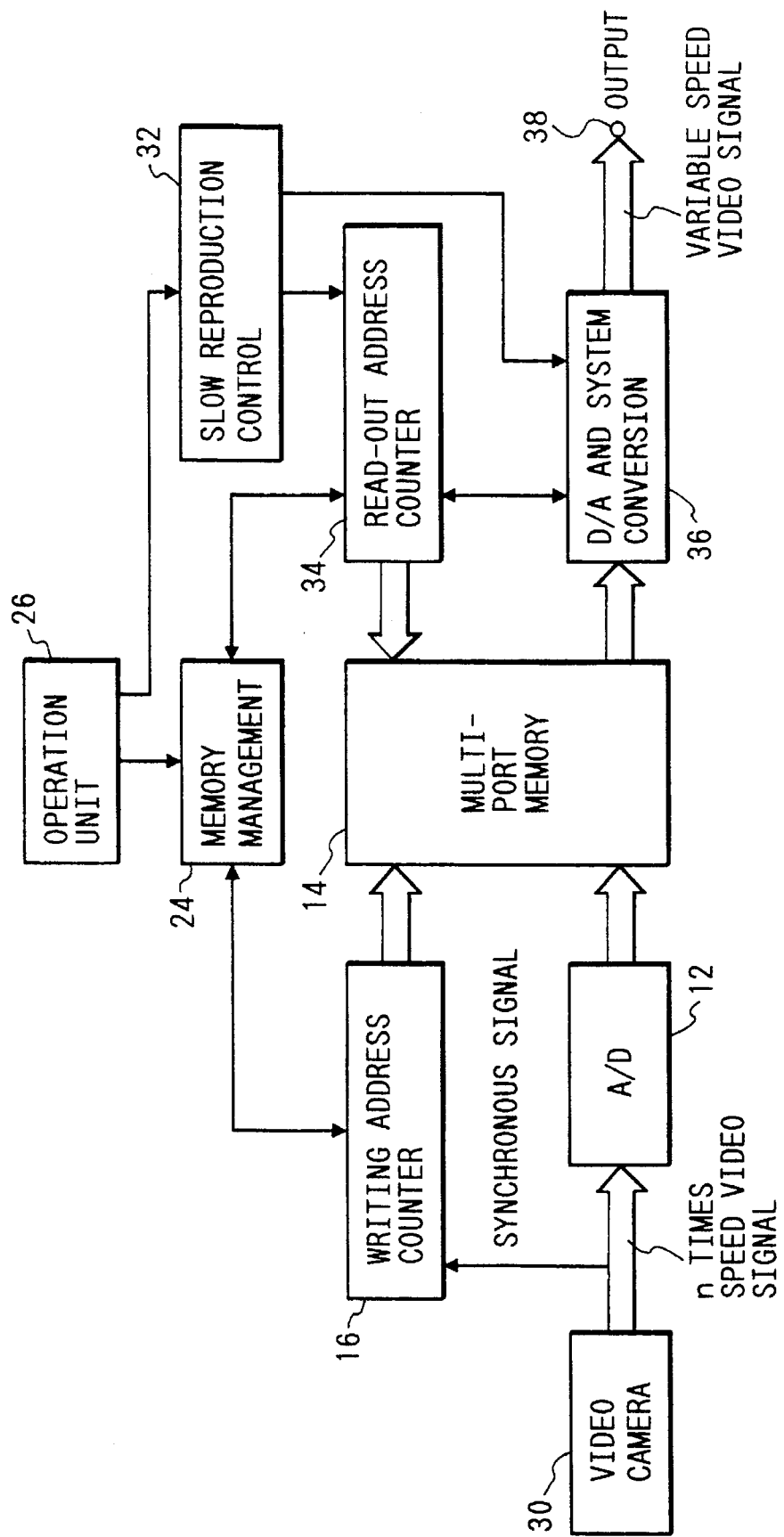
FIG. 5 is a block diagram showing the structure of an image memorizing device as another embodiment of the present invention.

Next, description will be made as to another embodiment where the present invention is applied to processing of an n-times speed video signal. FIG. 5 shows the structure of the embodiment in a block form. The constituents identical to those in FIG. 2 are designated the same reference numerals. Reference numeral 30 designates a video camera which is capable of making a film at a field frequency n times that of a standard television signal, the output video signal of which is written into a memory 14 by an A/D convertor 12, a writing address counter 16 and a memory managing circuit 24, similarly to the device shown in FIG. 2. A slow reproduction control circuit 32 controls a read-out address counter 34 to read data from the memory 14 at an arbitrary speed and converts the read data to a standard television signal by a D/A converting and system converting circuit 36. More specifically, in the present embodiment one field portion of a video signal is read out in one field period of a standard television signal, however, in a 1/n slow reproduction mode, a read-out field address is updated once per field period.

In a normal reproduction mode, a field address read out once per field period is advanced by n fields. Further, in a ½n slow reproduction mode, a signal in the one and same field is repeatedly read out twice over two field periods, and a read-out field address is updated once per two field periods. By thus constructing the device, a video signal can be outputted at an arbitrary speed.

As described above, according to the device of the present invention disclosed in FIGS. 2 to 5, by setting a particular address area of a memory as a writing inhibited area, it is possible to memorize two or more kinds of different moving images in a single memory and read them therefrom.

Next, another embodiment of the present invention will be described.

Figure 6:
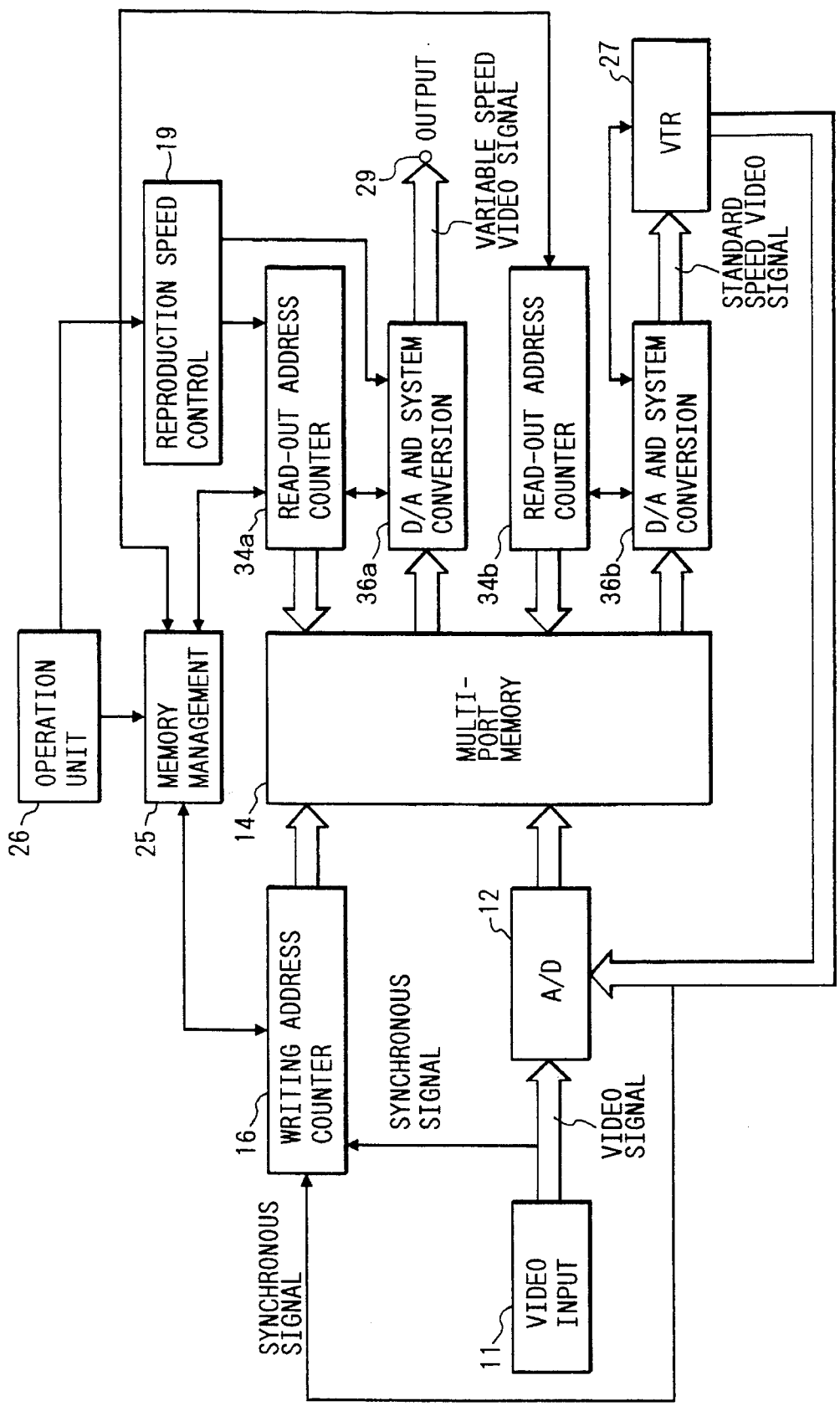
FIG. 6 is a block diagram showing the structure of an image memorizing device as a further embodiment of the present invention.

FIG. 6 is a block diagram showing the structure of an image memorizing device as another embodiment of the present invention, wherein constituents similar to those in FIG. 5 are designated the same reference numeral, and explanation thereof will be omitted.

Reference numeral 19 designates a reproduction speed control circuit for controlling a read-out speed (that is, an output speed of a read-out image) from a memory 14; 34a a read-out address counter for generating a read-out address of the memory 14 under the control of the reproduction speed control circuit 19; 36a a D/A and system converting circuit for converting video data read from the memory 14 by the read-out address counter 34A to an analog signal and further converting the analog signal to a video signal according to a predetermined system; and 25 an output terminal.

Also, reference numeral 27 designates a video tape recorder (VTR) for recording an image to be preserved; 25 a memory managing circuit for reading out an image to be preserved to have the VTR 27 record the same and for inhibiting writing into a recording area in which the image to be preserved is memorized for a necessary period; 34b a read-out address counter for generating a read-out address of the memory 14 under the control of the memory managing circuit 28; and 36*b* a D/A and system converting circuit for converting video data read from the memory 14 by the read-out address counter 34*b* to an analog signal and further converting the analog signal to a video signal according to a predetermined system. An output from the D/A and system converting circuit 36*b* is supplied to the VTR 27.

For re-loading a video signal recorded by the VTR 27 to the memory 14, a video signal output reproduced by the VTR 27 is applied to the A/D convertor 12, while a synchronous signal multiplexed with the reproduced video signal is applied to the writing address counter 16.

Next, the operation of the device shown in FIG. 6 will be described. Reference numeral 11 designates a video input terminal to which a video signal is inputted from a video camera. The operation for writing a video signal from the video input terminal 11 into the memory 14 is entirely the same as the operation for memorizing a video signal from the video camera 10 into the memory 14 of FIG. 2.

The memory 14, as described above, is handled as a ring memory. If a writing inhibited area is not set therein, the memory 14 stores a video signal of a past period T from the current time, wherein reference letter T represents a recordable period of the memory 14.

The whole recording area of the memory 14 is divided into n blocks in arbitrary sizes, and the memory managing circuit 25 holds this division information. The memory managing circuit 25 controls writing by the writing address counter 16, and read-out by the read-out address counters 20, 30 in this block unit.

For example, if the area between the points a and b shown in FIG. 4 is designated a block #1 and the remaining area block #2 by an operation unit 26, and if the block #1 is specified as a writing inhibited area, a writing vector W of the writing address counter 16, when reaching the point a, skips the area between the points a and b and indicates the address at the point b. Thus, video data memorized in the area between a and b is preserved. Also, with respect to read-out, read-out is permitted or inhibited in the specified block unit.

Next, a back-up operation will be described. Assume that video data is being written into a certain block, in the manner described above. Data is read from a writing inhibited block (a block in which an image to be preserved is recorded) other than the block into which video data is being written by the read-out address counter 34*b*, and converted to an analog signal and further to a signal according to the standard system by the D/A and system converting circuit 36*b*. Then, in association with an output operation of the D/A and system converting circuit 36*b*, the VTR 27 is operated to record the video signal converted to the standard system. Specifically, the D/A and system converting circuit 36*b* controls the VTR 27 to start and stop the recording. By these operations, the video signal to be preserved can be backed up on a recording medium by the VTR 27.

After the video signal has been backed up the VTR 27, when the read-out address counter 34*b* supplies the memory managing circuit 25 with a signal indicative of the termination of this back-up operation, the memory managing circuit 25 permits writing into the writing inhibited block from which the video signal has been read.

Since a video signal memorized in the memory 14 need to be backed up, a video signal read from the D/A and system converting circuit 36*b* is preferably a video signal at a standard speed. In the device shown in FIG. 6, since a video signal written into the memory 14 is a standard video signal, a field address is updated by the counter 34*b* once per field period of this standard video signal, whereby a normal reproduction can be performed.

On the other hand, a video signal may be outputted to an output terminal 29 at one of various speeds as the user desires. Specifically, the reproduction speed control circuit 19 can vary the updated period of the field address of the counter 34*a* via the operation unit 26. For example, when a slow motion reproduction is to be performed, the field address is updated once per several field periods, and video signals at the same field addresses are repeatedly read out during these several fields. Also, when a high speed search is to be performed, the field address may be advanced by several fields once per field period.

Figure 7:
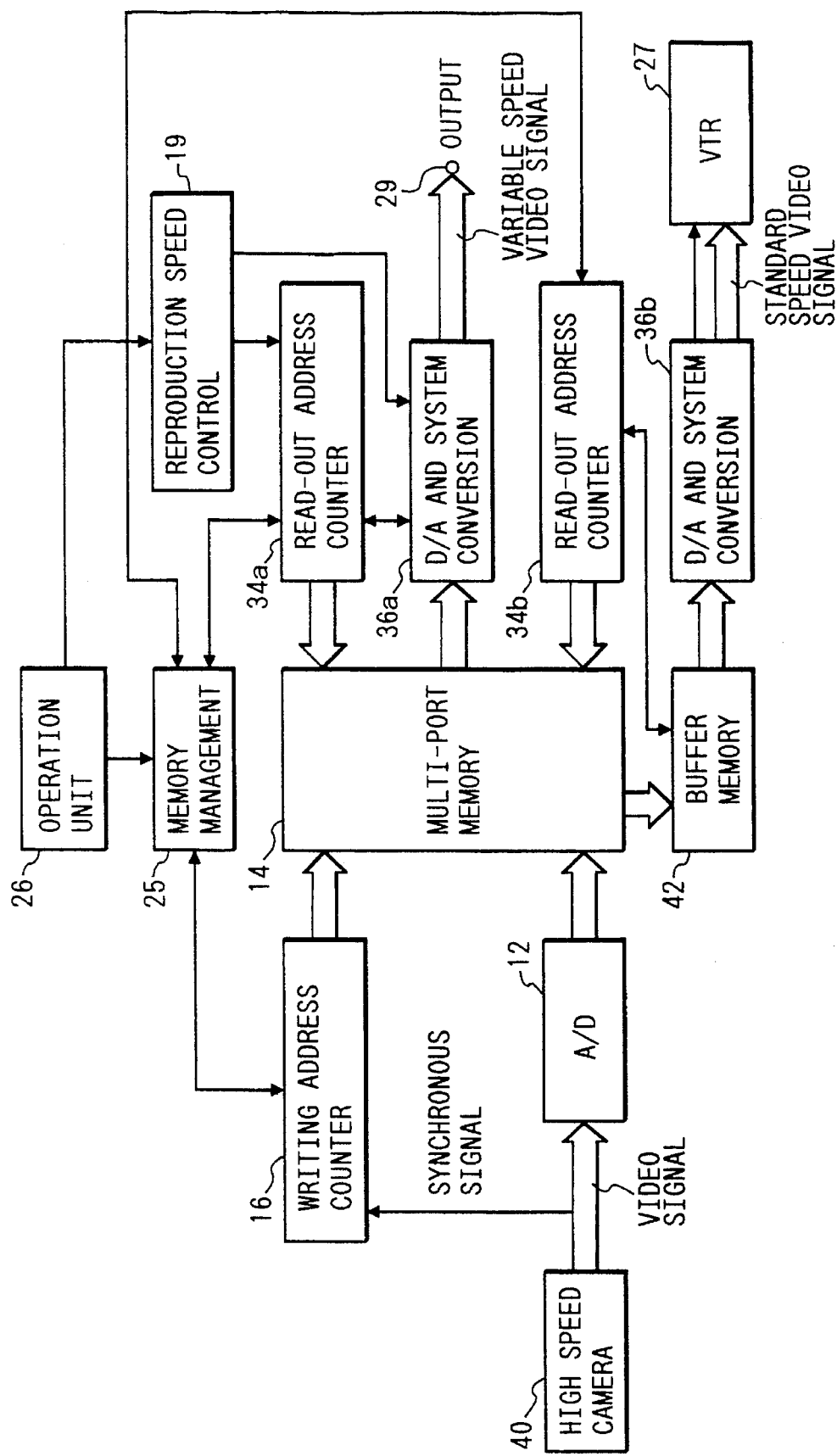
FIG. 7 is a block diagram showing the structure of an image memorizing device as a further embodiment of the present invention.

FIG. 7 is a block diagram showing the structure of a second embodiment of the present invention. Constituents having functions similar or analogous to those in FIG. 6 are designated the same reference numerals. As an image source, there is connected a high speed camera 40 which outputs a video signal at a field frequency n times that of the standard television system, and a high speed buffer memory 42 is connected between a multi-port memory 14 and a D/A and system converting circuit 36*b*. A transfer speed from the memory 14 to the buffer memory 42 is the same as a speed at which data is written into the memory 14, that is, n times a transfer speed from the D/A and system converting circuit 36*b* to a VTR 26. The D/A and system converting circuit 36*b* sequentially converts video data from the buffer memory 42 to a standard video signal which in turn is recorded on a video tape by the VTR 27.

Thus, even a high speed video signal can be backed up at a high speed, and accordingly the memory can be highly efficiently utilized.

Although in the above-mentioned embodiment, the memory 14 is divided into two blocks respectively having a different size from each other and managed, it may be divided into m banks of a fixed length (for example eight banks 1–8 in FIG. 8), and the presence or absence of back-up may be managed in the bank units. For example, if an area between points a and b is to be preserved in FIG. 8, writing addresses of banks #2, #3 including that area are skipped, and images recorded therein are backed up on a video tape. Such banks of a fixed length can alleviate the load of a memory managing circuit 25.

Figure 8:
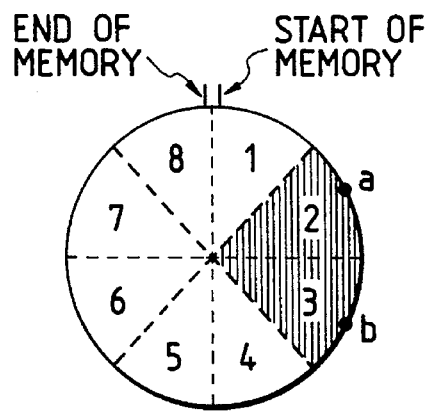
FIG. 8 is a diagram used for explaining another using manner of the memory in each embodiment.

As will be readily understood from the above explanation, according to the device described in connection with FIGS. 6–8, an important image memorized in a soild-state memory device can be preserved or backed up on a separate recording medium without being erased by a subsequent image. This back-up operation allows an efficient utilization of a memory capacity of the solid-state memory device. Further, since writing and read-out are simultaneously performed, data can be preserved on a separate recording medium at a high speed.

Figure 9:
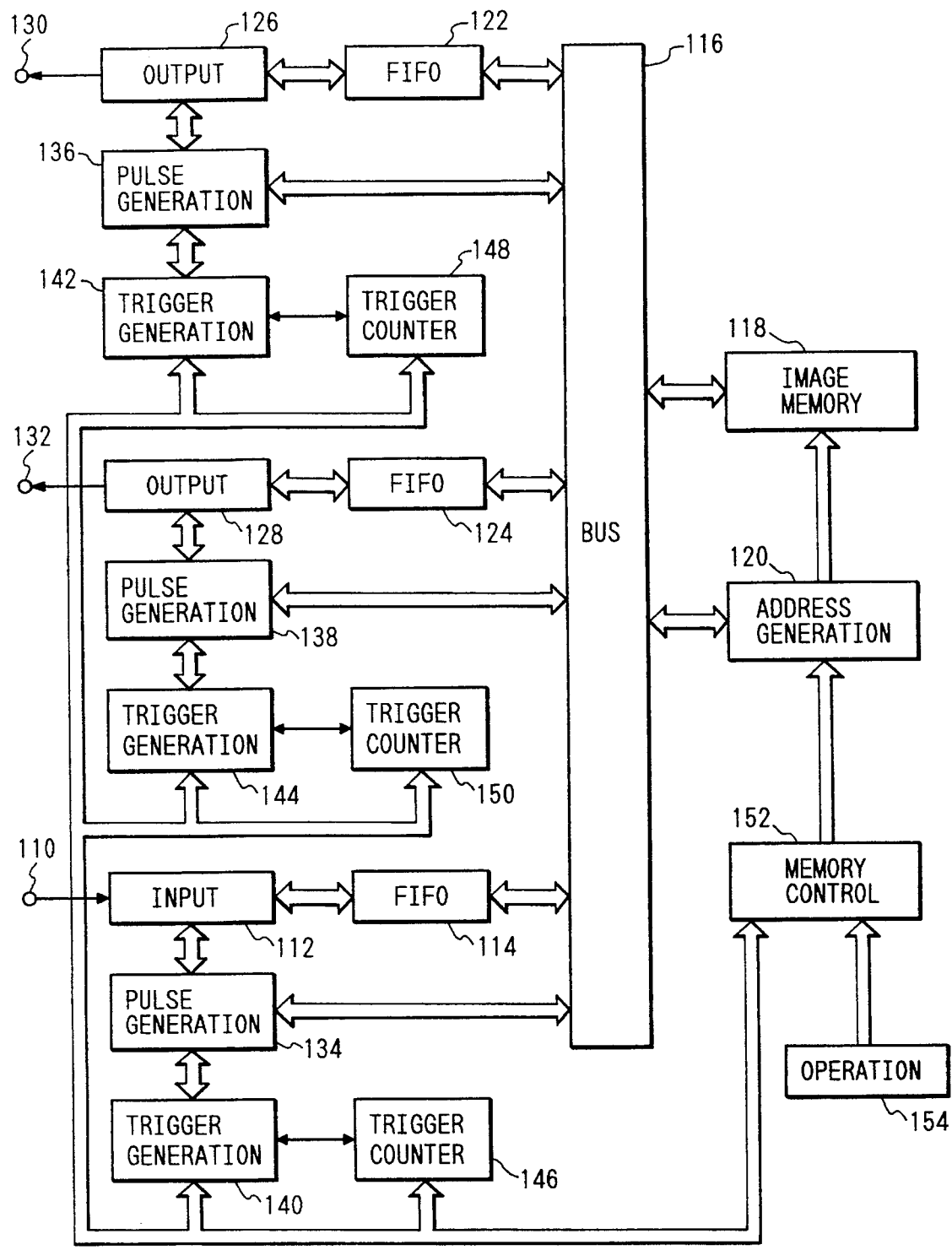
FIG. 9 is a block diagram showing the structure of an image memorizing device as another embodiment of the present invention.

FIG. 9 is a block diagram showing the structure of a further embodiment of the present invention. Reference numeral 110 designates an input terminal to which an image signal (moving pictures or a still image) is fed from a video camera or a video reproducing apparatus; 112 an input circuit comprising an A/D convertor for digitizing an image from the input terminal 110; 114 an FIFO (First-In First-Out) memory (buffer memory) for a synchronously supplying an output of the input circuit 112 to a bus 116; 118 an image memory; and 120 an address generating circuit for generating an address of the image memory 118. The bus 116 comprises a data bus, a plurality of control signal lines and a clock line.

Reference numerals 122, 124 designate FIFO memories for supplying respective output circuits 126, 128 with image data read from the image memory 118 and inputted through the bus 116. The output circuits 126, 128 respectively comprise, for example, a D/A convertor. Reference numerals 130, 132 designate output terminals for connecting to a monitor or a video recording apparatus.

Reference numerals 134, 136, 138 designates pulse generating circuits for generating a clock and control signals necessary to transfer data between the input and output circuits 112, 126, 128 and the FIFO memories 114, 122, 124 and to transfer data between the FIFO memories 114, 122, 124 and the image memory 118 via the bus 116; 140, 142, 144 trigger generating circuits for generating a request for transferring every predetermined amount of data between the input and output circuits 112, 126, 128 and the FIFO memories 114, 122, 124; and 146, 148, 150 trigger counters for counting the numbers of triggers generated by the trigger generating circuits 140, 142, 144, respectively.

Reference numeral 152 designates a memory control circuit for arbitrating a request for data transfer between the respective input and output circuits 112, 126, 128 and controlling data transfer between the image memory 118 and the FIFO memories 114, 122, 124; and 154 an operation unit for inputting an indication of an operation mode for the whole device.

Next, the operation of the present embodiment will be described in connection with a case where an image signal inputted to the input terminal 110 is stored in the image memory 118, by way of example.

The user indicates from the operation unit 154 the memory control circuit 152 to store input image data to the image memory 118. The memory control circuit 152 instructs the pulse generating circuit 134 of writing an output of the input circuit 112 into the FIFO memory 114. The pulse generating circuit 134 generates a control signal for writing into the FIFO memory 114 in synchronism with a synchronous signal of an image signal inputted from the input terminal 110. The trigger generating circuit 140 in turn transmits a trigger signal to the trigger counter 146 and the memory control circuit 152 every time a predetermined amount of image data less than one frame portion of image (hereinafter referred to the memory unit) is written into the FIFO memory 114. The trigger counter 146 counts this trigger signal and supplies the memory control circuit 52 with the number of counted trigger signals.

The memory control circuit 152, in response to the trigger signal from the trigger generating circuit 140, has the trigger counter 146 output the number of counted trigger signals to the address generating circuit 120 and simultaneously transfer the number of counted trigger signals to the image memory 118 via the bus 116. The address generating circuit 120 generates an address for each of data in the memory unit, at which image data from the FIFO memory 114 is written into the image memory 118. Assuming here that the foregoing predetermined amount is equal to $2^n$ pixels, a memory using situation is as shown in FIG. 10.

Figure 10:
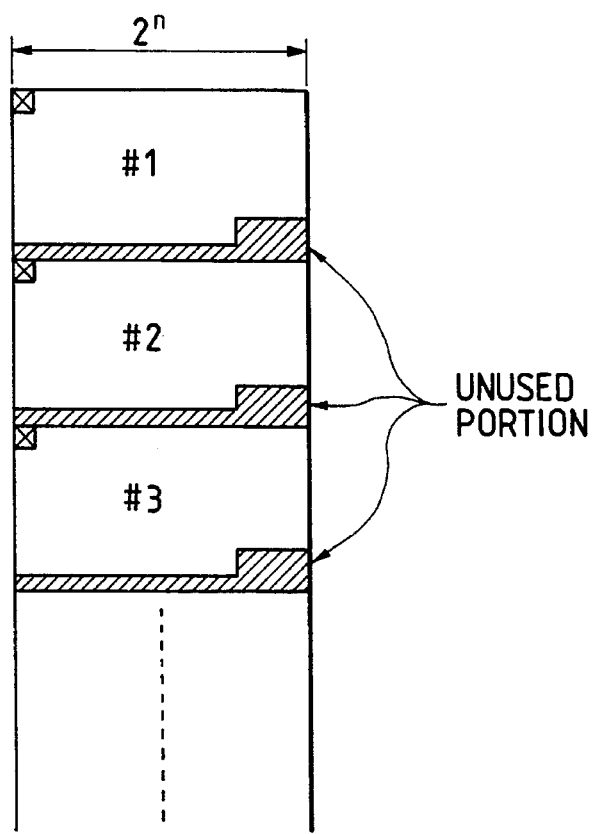
FIG. 10 is a diagram showing a using situation of a memory in the device of the embodiment shown in FIG. 9.

By the above operations, image data is close-packed in the image memory 118, whereby unused portions are left only in hatched areas shown in FIG. 10. Thus, the unused portion can be largely reduced. Incidentally, blocks #1, #2, #3 respectively indicate image data of one frame portion.

Read-out of image data from the image memory 118 to the output circuits 126, 128 is similarly executed by generating a trigger signal for requesting data transfer in the memory units. However, data transfer between the image memory 118 and the FIFO memories 122, 124 is executed only with one of the FIFO memories at a time, so that the memory control circuit 152 arbitrates respective transfer requests so as to prevent the transfer requests from being simultaneously generated.

As will be readily understood from the above explanation, the embodiment of FIG. 9 provides an image memorizing device which can reduce unused portions, facilitate the address management of the memory 118, and present a high utilizating efficiency.

What is claimed is:

1. An image storing device, comprising:

(a) input means for inputting a motion video signal;

(b) a memory into which the motion video signal inputted from said input means can be written;

(c) writing address control means for cyclically specifying writing addresses of said memory to which the motion video signal is written; and (d) inhibiting means for inhibiting a part of addresses of said memory from being specified by said writing address control means, wherein said writing address control means skips the part of addresses to continuously write the motion video signal to addresses before and after the part of addresses when said inhibiting means operates.

2. A device according to claim 1, wherein said inhibiting means includes an operation member for manually specifying said part of address area.

3. A device according to claim 1, further comprising:

read-out address control means for specifying read-out addresses of said memory; and output means for outputting a video signal readout from said memory.

4. A device according to claim 3, wherein said read-out address control means can switch an update period of said read-out addresses in the frame units of said video signal.

5. A device according to claim 3, wherein:

when said read-out address control means specifies said part of the addresses of said memory, while a video signal is being read out from addresses in said memory specified by said read-out address control means, said writing address control means cyclically specifies addresses of said memory except for said part of the writing addresses, and a video signal can be written to addresses of said memory specified by said writing address control means.

6. A device according to claim 3, further comprising recording means for recording a video signal outputted from said output means on a recording medium.

7. An image storing device comprising:

(a) a memory capable of storing a video signal;

(b) recording means for recording a video signal read from said memory on a recording medium;

(c) writing address control means for cyclically specifying writing addresses of said memory;

(d) inhibiting means for inhibiting a video signal from being written into part of addresses of said memory, wherein said writing address control means cyclically specifies writing addresses for the remaining addresses except for said part of addresses when said inhibiting means inhibits a video signal from being written into said part of addresses; and (e) releasing means for responsively releasing writing inhibition set by said inhibiting means which inhibits a video signal from being written into said part of addresses upon completing recording of a video signal read out from said part of addresses by said recording means.

8. An image storing device, comprising:

(a) a memory capable of storing a video signal;

(b) writing address control means for cyclically specifying writing addresses of said memory;

(c) output means for outputting a video signal read from said memory;

(d) recording means for recording a video signal outputted from said output means on a recording medium, wherein said output means controls said recording means so as to operate said recording means while a video signal is being outputted; and (e) inhibiting means for inhibiting a video signal from being written into part of addresses of said memory, wherein said writing address control means cyclically specifies writing addresses for the remaining addresses except for said part of addresses when said inhibiting means inhibits a video signal from being written into said part of addresses.

9. An image storing device comprising:

(a) a memory capable of storing a motion video signal;

(b) writing means including address control means for specifying writing addresses of said memory to write the motion video signal into memory;

(c) inhibiting means for inhibiting said writing means from specifying a part of addresses of said memory; and (d) read-out means including read-out address control means for specifying read-out addresses of said storage area of said memory, said read-out means being capable of reading a motion video signal, which has been previously stored in said part of addresses before the writing addresses are inhibited from being specified by said inhibiting means, during a writing operation of said writing means.

10. A device according to claim 9 wherein said writing address control means cyclically specifies writing addresses of the memory except for said part of addresses when said inhibiting means inhibits a video signal from being written into said part of addresses.

11. An image storing device comprising:

(a) a memory capable of storing a video signal;

(b) writing means including writing address control means for specifying writing addresses of said memory;

(c) inhibiting means for inhibiting said writing means from specifying writing addresses of a predetermined area of said storage area of said memory;

(d) read-out means including read-out address control means for specifying read-out addresses of said memory; and (e) cancel means for cancelling inhibition by said inhibiting means in response to completion of a read-out operation of a video signal in the part of addresses by said read out means.

* * * * *

UNITED STATES PATENT AND TRADEMARK OFFICE
CERTIFICATE OF CORRECTION

PATENT NO. : 5,523,799
DATED : June 4, 1996
INVENTOR(S) : Yuichiro Hattori

It is certified that error appears in the above-indentified patent and that said Letters Patent is hereby corrected as shown below:

Column 3, line 58, before "reached" please insert -- been --;

Column 4, line 58, change "34A" to -- 34a --; and

Column 4, line 60, change "25" to -- 29 --.

Signed and Sealed this

Twenty-fourth Day of September, 1996

Attest:

BRUCE LEHMAN

*Attesting Officer*     *Commissioner of Patents and Trademarks*